(12) United States Patent
Lee et al.

(10) Patent No.: US 11,151,349 B2
(45) Date of Patent: Oct. 19, 2021

(54) FINGERPRINT SENSORS AND FINGERPRINT SENSOR ARRAYS AND DEVICES

(71) Applicant: Samsung Electronics Co., Ltd., Suwon-si (KR)

(72) Inventors: Gae Hwang Lee, Seongnam-si (KR); Kyung Bae Park, Hwaseong-si (KR); Sung Jun Park, Yongin-si (KR); Sung Young Yun, Suwon-si (KR); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/729,993

(22) Filed: Dec. 30, 2019

(65) Prior Publication Data
US 2020/0364431 A1    Nov. 19, 2020

(30) Foreign Application Priority Data

May 15, 2019  (KR) .................. 10-2019-0057097

(51) Int. Cl.
*G06K 9/00* (2006.01)
*H01L 51/52* (2006.01)

(52) U.S. Cl.
CPC ......... *G06K 9/0002* (2013.01); *G06K 9/0004* (2013.01); *G06K 9/00033* (2013.01); *G06K 9/00046* (2013.01); *H01L 51/5284* (2013.01)

(58) Field of Classification Search
CPC ............. G06K 9/0002; G06K 9/00033; G06K 9/0004; G06K 9/00046; H01L 51/5284
See application file for complete search history.

(56) References Cited

U.S. PATENT DOCUMENTS

| 8,519,382 B2 | 8/2013 | Boulais et al. |
| 10,210,373 B2 | 2/2019 | Kim et al. |
| (Continued) | | |

FOREIGN PATENT DOCUMENTS

| EP | 3293766 A1 | 3/2018 |
| KR | 10-2006-0012844 A | 2/2006 |
| KR | 101376228 B1 | 4/2014 |

OTHER PUBLICATIONS

Extended European Search Report dated Sep. 15, 2020 for corresponding European Application No. 20163096.9.
(Continued)

*Primary Examiner* — Premal R Patel
(74) *Attorney, Agent, or Firm* — Harness, Dickey & Pierce, P.L.C.

(57) ABSTRACT

A fingerprint sensor may include first and second electrodes, a light absorption layer isolated from direct contact with the first and second electrodes, and an insulation layer between the first electrode and the light absorption layer and further between the second electrode and the light absorption layer. A reflective layer may be between the light absorption layer and the first electrode. The insulation layer may include a first insulation layer between the first electrode and the light absorption layer, and a second insulation layer between the second electrode and the light absorption layer. A fingerprint sensor array including a plurality of fingerprint sensors may at least partially expose a plurality of sub-pixels of a display panel on which the fingerprint sensor array is located.

31 Claims, 13 Drawing Sheets

(56) References Cited

U.S. PATENT DOCUMENTS

| | | | |
|---|---|---|---|
| 2007/0098227 A1 | 5/2007 | Takahashi | |
| 2011/0096027 A1* | 4/2011 | Jeon | G06F 3/0412 345/175 |
| 2016/0357313 A1* | 12/2016 | Yang | G06F 3/0412 |
| 2017/0154911 A1* | 6/2017 | Jin | H01L 27/14647 |
| 2017/0213973 A1* | 7/2017 | Yun | H01L 27/307 |
| 2017/0338431 A1* | 11/2017 | Ro | H01L 51/0072 |
| 2018/0033835 A1* | 2/2018 | Zeng | G06K 9/00013 |
| 2018/0035923 A1* | 2/2018 | Kang | A61B 5/117 |
| 2018/0060641 A1* | 3/2018 | Kim | G06K 9/0004 |
| 2018/0088712 A1* | 3/2018 | Kim | G02F 1/13338 |
| 2018/0114814 A1* | 4/2018 | Yun | H01L 51/4253 |
| 2018/0130857 A1* | 5/2018 | Lee | H01L 51/5253 |
| 2018/0151639 A1* | 5/2018 | Luo | G06K 9/00033 |
| 2018/0204890 A1* | 7/2018 | Akimoto | H01L 51/0097 |
| 2019/0065815 A1 | 2/2019 | Park et al. | |
| 2019/0294848 A1* | 9/2019 | Zeng | H01L 27/3234 |
| 2020/0097700 A1* | 3/2020 | Lin | G06K 9/00013 |
| 2020/0258950 A1* | 8/2020 | Choi | H01L 27/124 |
| 2020/0319731 A1* | 10/2020 | Yeke Yazdandoost | H01L 25/165 |

OTHER PUBLICATIONS

Henry C.H., "Photocapacitance in the study of nonradiative centers", Journal of Luminescence, Elsevier BV North-Holland, NL, vol. 7, Jan. 1, 1973, pp. 127-145, XP024440668, ISSN: 0022-2313, DOI: 10.1016/0022-2313(73)90063-X.

Wensheng Liang et al., "Investigation of field-effect passivation and interface state parameters at the Al2O3/Si interface", 27th European Photovoltaic Solar Energy Conference and Exhibition, Proceedings WIP—Renewable Energies, Munich, Germany, 2012, pp. 1258-1261, XP002800122, ISBN: 3-936338-28-0.

* cited by examiner

FINGERPRINT SENSORS AND FINGERPRINT SENSOR ARRAYS AND DEVICES

CROSS-REFERENCE TO RELATED APPLICATION

This application claims priority to and the benefit of, under 35 U.S.C. § 119, Korean Patent Application No. 10-2019-0057097 filed in the Korean Intellectual Property Office on May 15, 2019, the entire contents of which are incorporated herein by reference.

BACKGROUND

1. Field

Fingerprint sensors, fingerprint sensor arrays, and devices are disclosed.

2. Description of the Related Art

As security of electronic devices becomes more important in recent years, electronic devices include various user authentication functions to provide services to authenticated users. One of these user authentication functions is a fingerprint authentication function. The fingerprint authentication function may be performed using a fingerprint sensor, which may determine a correspondence between a user's fingerprint and a pre-stored fingerprint.

SUMMARY

Some example embodiments provide one or more fingerprint sensors configured to implement improved performance with a simple structure and process.

Some example embodiments provide one or more fingerprint sensor arrays that include the one or more fingerprint sensors.

Some example embodiments provide one or more devices that include the one or more fingerprint sensors and/or the one or more fingerprint sensor arrays.

According to some example embodiments, a fingerprint sensor may include a first electrode, a second electrode, a light absorption layer isolated from direct contact with the first electrode, the light absorption layer isolated from direct contact with the second electrode, and an insulation layer between the first electrode and the light absorption layer, the insulation layer between the second electrode and the light absorption layer.

The light absorption layer may include a p-type semiconductor and an n-type semiconductor, and at least one of the p-type semiconductor or the n-type semiconductor may be a light absorbing material configured to absorb light in at least a portion of a visible wavelength region.

The light absorbing material may include an organic light absorbing material.

The fingerprint sensor may further include a reflective layer between the light absorption layer and the first electrode.

The first electrode and the second electrode may be on opposite sides of the light absorption layer, such that the light absorption layer is between the first electrode and the second electrode. The insulation layer may include a first insulation layer between the first electrode and the light absorption layer and a second insulation layer between the second electrode and the light absorption layer.

The first electrode and the second electrode may be in parallel with each other on a same side of the light absorption layer, and the insulation layer and the light absorption layer may be each on both the first electrode and the second electrode.

The fingerprint sensor may be configured to sense capacitance changes according to an intensity of light absorbed in the light absorption layer.

The fingerprint sensor may be configured to have no substantial current changes according to an intensity of light absorbed in the light absorption layer.

A fingerprint sensor array may include the fingerprint sensor.

A device may include the fingerprint sensor.

According to some example embodiments, a device may include a display panel configured to display an image in a display area of the display panel, and a fingerprint sensor array on the display panel. The fingerprint sensor array may include a plurality of fingerprint sensors. Each fingerprint sensor of the plurality of fingerprint sensors may include a first electrode, a second electrode, a light absorption layer isolated from direct contact with the first electrode, the light absorption layer isolated from direct contact with the second electrode, and an insulation layer between the first electrode and the light absorption layer, the insulation layer between the second electrode and the light absorption layer.

The plurality of fingerprint sensors may be in some or all of the display area of the display panel.

The display area of the display panel may include an active region including a plurality of sub-pixels configured to emit light, and a non-active region that does not include the plurality of sub-pixels. The plurality of fingerprint sensors may be in the non-active region such that the plurality of fingerprint sensors at least partially do not vertically overlap any sub-pixels of the plurality of sub-pixels.

The plurality of fingerprint sensors may each vertically overlap a separate portion of the display panel that is between at least two adjacent sub-pixels of the plurality of sub-pixels.

Each fingerprint sensor may further include a reflective layer between the light absorption layer and the first electrode.

The first electrode may extend in a first direction. The second electrode may extend in a second direction that intersects the first direction. The light absorption layer may be between the first electrode and the second electrode at a bridge of the first electrode and the second electrode.

The insulation layer may include a first insulation layer between the first electrode and the light absorption layer and a second insulation layer between the second electrode and the light absorption layer.

The first electrode and the second electrode may be in parallel with each other on a same side of the light absorption layer, and the insulation layer and the light absorption layer may be each on both the first electrode and the second electrode.

The light absorption layer may include a p-type semiconductor and an n-type semiconductor, and at least one of the p-type semiconductor or the n-type semiconductor may be a light absorbing material configured to absorb light in at least a portion of a visible wavelength region.

Each fingerprint sensor may be configured to sense capacitance changes according to an intensity of light absorbed in the light absorption layer of the each fingerprint sensor. The each fingerprint sensor may be configured to have no substantial current changes according to the intensity of light absorbed in the light absorption layer of the each fingerprint sensor.

According to some example embodiments, a device may include a display panel including a plurality of sub-pixels, the plurality of sub-pixels isolated from direct contact with each other by one or more non-active regions of the display panel, and a fingerprint sensor array on the display panel, the fingerprint sensor including a plurality of fingerprint sensors, each separate fingerprint sensor of the plurality of fingerprint sensors at least partially overlapping a separate portion of the one or more non-active regions of the display panel, such that the plurality of sub-pixels are at least partially exposed by the plurality of fingerprint sensors. Each fingerprint sensor may include a first electrode, a second electrode, a light absorption layer isolated from direct contact with the first electrode, the light absorption layer isolated from direct contact with the second electrode, and an insulation layer between the first electrode and the light absorption layer, the insulation layer between the second electrode and the light absorption layer.

The device may further include a memory storing a program of instructions; and a processor configured to execute the program of instructions to control the display panel to cause one or more sub-pixels of the plurality of sub-pixels to emit light, drive the fingerprint sensor array to cause the plurality of fingerprint sensors to generate separate, respective electrical signals based on changes in capacitance in the light absorption layers of the plurality of fingerprint sensors in response to reflection of the emitted light from an object, generate an image of the object based on the electrical signals, compare the generated image with a stored image, and selectively grant user access to at least a portion of the device, via a user interface of the device, based on a determination of whether the generated image matches the stored image within a threshold confidence level.

At least a portion of the display panel may be a curved portion, and at least one fingerprint sensor of the plurality of fingerprint sensors may be on the curved portion of the display panel.

At least two sets of one or more fingerprint sensors of the plurality of fingerprint sensors may have different structures.

At least one set of one or more fingerprint sensors may define a pattern on the display panel.

Each fingerprint sensor of the plurality of fingerprint sensors may further include a reflective layer between the light absorption layer and the first electrode.

The first electrode may extend in a first direction, the second electrode may extend in a second direction that intersects the first direction, and the light absorption layer may be between the first electrode and the second electrode at a bridge of the first electrode and the second electrode.

The insulation layer may include a first insulation layer between the first electrode and the light absorption layer and a second insulation layer between the second electrode and the light absorption layer.

The first electrode and the second electrode may extend in parallel with each other on a same side of the light absorption layer, and the insulation layer and the light absorption layer may be each on both the first electrode and the second electrode.

'The light absorption layer may include a p-type semiconductor and an n-type semiconductor, and at least one of the p-type semiconductor or the n-type semiconductor may be a light absorbing material configured to absorb light in at least a portion of a visible wavelength region.

Each fingerprint sensor may be configured to sense capacitance changes according to a quantity of light absorbed in the light absorption layer of the fingerprint sensor, and each fingerprint sensor may be configured to have no substantial current changes according to a quantity of light absorbed in the light absorption layer of the fingerprint sensor.

An improved fingerprint-sensing performance may be realized with a simple structure and process.

DETAILED DESCRIPTION

Figure 1:
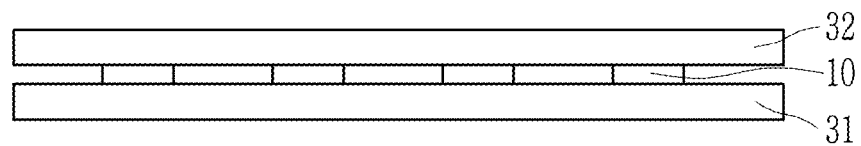
FIG. 1 is a cross-sectional view showing an example of a fingerprint sensor array according to some example embodiments.

Hereinafter, some example embodiments will be described in detail in order to facilitate a person skilled in the art in the technical field. However, actually applied structures may be embodied in various different forms and are not limited to example embodiments described below.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, a fingerprint sensor according to some example embodiments will be described.

Figure 2:
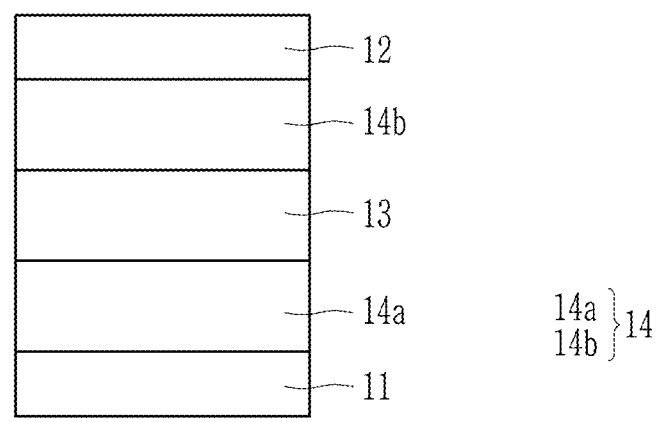
FIG. 2 is a cross-sectional view showing an example of a fingerprint sensor according to some example embodiments.

FIG. 1 is a cross-sectional view showing an example of a fingerprint sensor array according to some example embodiments, and FIG. 2 is a cross-sectional view showing an example of a fingerprint sensor according to some example embodiments.

Referring to FIGS. 1 and 2, a fingerprint sensor 10 according to some example embodiments includes a first electrode 11 and a second electrode 12, a light absorption layer 13 between the first electrode 11 and the second electrode 12, and an insulation layer 14 between the first electrode 11 and the light absorption layer 13 and between the second electrode 12 and the light absorption layer 13.

The fingerprint sensor 10 may be supported (e.g., may be structurally supported) by a lower substrate 31 and may be covered with an upper substrate 32. However, at least one of the lower substrate 31 and the upper substrate 32 may be omitted. The lower substrate 31 and the upper substrate 32 may be for example made of (e.g., may at least partially comprise) an inorganic material such as glass, an organic material such as polycarbonate, polymethylmethacrylate, polyethyleneterephthalate, polyethylenenaphthalate, polyamide, polyethersulfone, or a combination thereof, or a silicon wafer.

The major surface of the first electrode 11 and the major surface of the second electrode 12 are facing each other (e.g., are opposing surfaces).

One of the first electrode 11 and the second electrode 12 is an anode, and the other is a cathode. For example, the first electrode 11 may be a cathode and the second electrode 12 may be an anode. For example, the first electrode 11 may be an anode and the second electrode 12 may be a cathode.

At least one of the first electrode 11 and the second electrode 12 may be a transparent electrode. Herein, the transparent electrode may have a high light transmittance of greater than or equal to about 80%, greater than or equal to about 85%, greater than or equal to about 88%, or greater than or equal to about 90% and may include, for example an oxide conductor, a carbon conductor, and/or a metal thin film. The oxide conductor may include for example one or more of indium tin oxide (ITO), indium zinc oxide (IZO), zinc tin oxide (ZTO), aluminum tin oxide (AITO), and aluminum zinc oxide (AZO). The carbon conductor may be for example one or more of graphene and a carbon nanostructure. The metal thin film may be a metal thin layer having a thin thickness of several nanometers or several tens of nanometers or a metal thin layer of a single layer or a multiple layer having a thin thickness of several nanometers to several tens of nanometers doped with a metal oxide.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

One of the first electrode 11 and the second electrode 12 may be a reflective electrode. The reflective electrode may have for example a light transmittance of less than about 10% or a high reflectance of less than or equal to about 5%. For example, the reflective electrode may include a reflective conductor such as a metal and may include, for example aluminum (Al), silver (Ag), gold (Au), or an alloy thereof.

For example, the first electrode 11 and the second electrode 12 may respectively be a transparent electrode. For example, the first electrode 11 may be a reflective electrode, and the second electrode 12 may be a transparent electrode. For example, the first electrode 11 may be a transparent electrode, and the second electrode 12 may be a reflective electrode.

The first electrode 11 and the second electrode 12 may have various shapes and may have each independently a rod-shape extending in one direction, sheet-shape, or diamond-shape, but is not limited thereto.

As shown in FIG. 2, the light absorption layer 13 is disposed between the first electrode 11 and the second electrode 12 and is spaced apart from (e.g., isolated from direct contact with) each of the first electrode 11 and the second electrode 12. Namely, the light absorption layer 13 does not contact the first electrode 11 and the second electrode 12. Restated, the light absorption layer 13 may be isolated from direct contact with the first electrode 11, and the light absorption layer 13 may be isolated from direct contact with the second electrode 12.

The light absorption layer 13 is configured to absorb light and generate charges (e.g., electrical signals) based on such absorbance, and may be configured to absorb, for example, light in at least a portion of a visible wavelength region, for example at least one of light in a green wavelength region (hereinafter, referred to as 'green light'), light in a blue wavelength region (hereinafter, referred to as 'blue light'), or light in a red wavelength region (hereinafter, referred to as 'red light').

The light absorption layer 13 may include one or more light absorbing materials, and the light absorbing material is not particularly limited as long as it may be configured to absorb light to generate charges. For example, the light absorbing material may be an organic light absorbing material, an inorganic light absorbing material, and an organic/inorganic light absorbing material. For example, at least one of the light absorbing materials may be an organic light absorbing material.

The light absorption layer 13 may include at least one p-type semiconductor and at least one n-type semiconductor which form (e.g., establish) a pn junction, and may be configured to generate excitons by light from the outside. At least one of the p-type semiconductor or the n-type semiconductor may be a light absorbing material configured to absorb light in at least a portion of a visible wavelength region (e.g., visible wavelength spectrum of light). For example, each of the p-type and n-type semiconductors may be a light absorbing material.

For example, the p-type semiconductor and the n-type semiconductor may independently be an organic light absorbing material, an inorganic light absorbing material and/or an organic/inorganic light absorbing material. For example, at least one of the p-type semiconductor or the n-type semiconductor may be an organic light absorbing material.

The light absorption layer 13 may include a double layer including a p-type layer including a p-type semiconductor and an n-type layer including an n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The light absorption layer 13 may include an intrinsic layer (I layer) in which a p-type semiconductor and an n-type semiconductor are blended in a bulk heterojunction form. Herein, the p-type semiconductor and the n-type semiconductor may be blended at a volume ratio (a thickness ratio) of about 1:9 to about 9:1, for example about 2:8 to about 8:2, about 3:7 to about 7:3, about 4:6 to about 6:4, or about 5:5.

The light absorption layer 13 may further include a p-type layer and/or an n-type layer in addition to the intrinsic layer. The p-type layer may include the aforementioned p-type semiconductor and the n-type layer may include the aforementioned n-type semiconductor. For example, the p-type layer and/or the n-type layer may be included in various combinations of a p-type layer/I layer, an I layer/n-type layer, a p-type layer/I layer/n-type layer, and the like.

As shown in FIG. 2, the first electrode 11 and the second electrode 12 may be on opposite sides of the light absorption layer 13, such that the light absorption layer 13 is between the first electrode 11 and the second electrode 12. As further shown in FIG. 2, the insulation layer 14 may include a first insulation layer 14a that is between the first electrode 11 and the light absorption layer 13. As shown in FIG. 2, the insulation layer 14 may include a second insulation layer 14b between the second electrode 12 and the light absorption layer 13. As shown in FIG. 2, the first insulation layer 14a may be directly between the first electrode 11 and the light absorption layer 13, such that opposite surfaces of the first insulation layer 14a directly contact the first electrode 11 and the light absorption layer 13, respectively. As shown in FIG. 2, the second insulation layer 14b may be directly between the second electrode 12 and the light absorption layer 13, such that opposite surfaces of the second insulation layer 14b directly contact the second electrode 12 and the light absorption layer 13, respectively.

Each of the first insulation layer 14a and the second insulation layer 14b may include an insulating material, and such an insulating material may include an organic insulating material, an inorganic insulating material, and/or an organic/inorganic insulating material. The organic insulating material may be for example polyvinylphenol, polyimide, polyamide, polyamideimide, polyvinyl alcohol, polyvinylchloride, polymethylmethacrylate, polystyrene, or a combination thereof and the inorganic insulating material may be for example a silicon oxide, a silicon nitride, an aluminum oxide, a hafnium oxide, a magnesium oxide, a zirconium oxide, a titanium oxide, a tantalum oxide, or a combination thereof, but is not limited thereto.

The first insulation layer 14a may separate the first electrode 11 and the light absorption layer 13 therebetween (e.g., may be an interposing element therebetween to isolate the first electrode 11 and the light absorption layer 13 from direct contact with each other) and thereby be configured to block charges generated by the light in the light absorption layer 13 from moving to the first electrode 11. The first insulation layer 14a may be the only interposing element between the first electrode 11 and the light absorption layer 13. The second insulation layer 14b may separate the second electrode 12 and the light absorption layer 13 therebetween (e.g., may be an interposing element therebetween to isolate the second electrode 12 and the light absorption layer 13 from direct contact with each other) and thereby be configured to block charges generated by the light in the light absorption layer 13 from moving to the second electrode 12. The second insulation layer 14b may be the only interposing element between the second electrode 12 and the light absorption layer 13. Therefore, current may not flow between the first electrode 11 and the light absorption layer 13 and between the second electrode 12 and the light absorption layer 13, and there may be no substantial current changes according to a quantity of light absorbed by the light absorption layer 13.

In some example embodiments, when a particular (or, alternatively, predetermined) voltage is applied to the first electrode 11 and the second electrode 12, holes and electrons separated from excitons generated in the light absorption layer 13 may be vertically polarized depending on the positive or negative voltage of the first electrode 11 and the second electrode 12 and thereby, generate an electric field and accordingly, change particular (or, alternatively, predetermined) capacitance of the fingerprint sensor 10. Herein, when a large quantity (e.g., amount) of light is absorbed in the light absorption layer 13, many electrons and holes may be generated and thus exhibit high capacitance, and when small quantity of light is absorbed in the light absorption layer 13, less electrons and holes may be generated and thus exhibit low capacitance. Accordingly, the fingerprint sensor 10 according to any of the example embodiments will be understood to be configured to "sense" capacitance changes according to an amount (e.g., intensity) of light absorbed in the light absorption layer 13 of the fingerprint sensor 10. In other words, the fingerprint sensor 10 according to some example embodiments may be configured to sense a fingerprint by using the capacitance changes depending on the quantity (e.g., amount, intensity, etc.) of light absorbed in the light absorption layer 13 of the fingerprint sensor 10. For example, the fingerprint sensor 10 may be configured to generate one or more electrical signals according to capacitance changes in the fingerprint sensor 10, according to an intensity of light absorbed in the light absorption layer 13, where said electrical signals may be processed to generate at least a portion of an image of a fingerprint that is sensed by the fingerprint sensor 10. In some example embodiments, where a fingerprint sensor array of fingerprint sensors 10 is used to sense a fingerprint, the electrical signals output by each separate fingerprint sensor 10 of the array may be processed to generate a separate pixel of an image of the fingerprint sensed by the fingerprint sensors 10 of the array.

Figure 6:
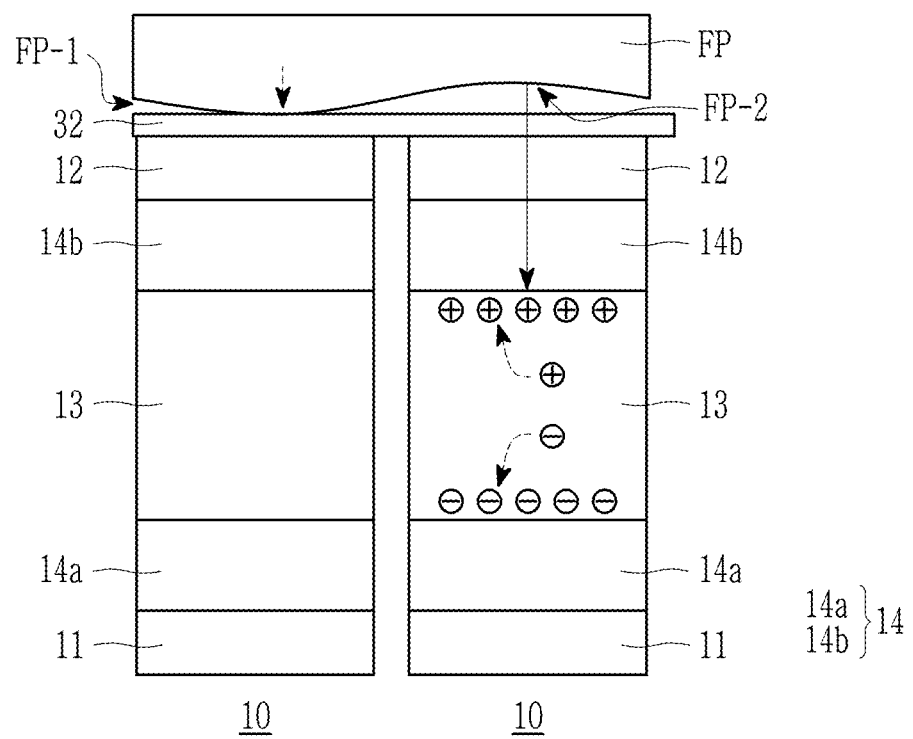
FIG. 6 is a schematic view showing a principle of a fingerprint sensor according to some example embodiments.

FIG. 6 is a schematic view showing a principle of a fingerprint sensor according to some example embodiments.

Referring to FIG. 6, a fingerprint FP that is on two, adjacent fingerprint sensors 10 may have an uneven surface and thus may have a height difference between a protruded portion, a ridge FP-1 and a concaved portion, a valley FP-2, and this height difference may result in a variation of an amount of light reflected from the fingerprint FP and thus absorbed by the fingerprint sensors that respectively overlap the protruded and concave portions of the fingerprint FP. For example, as shown in FIG. 6, the ridge FP-1 of the fingerprint FP closely adhered to (e.g., in direct contact with) an upper substrate 32 may reflect small or no quantity of light from the fingerprint FP to the light absorption layer 13 of the fingerprint sensor 10 that vertically overlaps the ridge FP-1, such that little or no charge is generated in said fingerprint sensor 10, while the valley FP-2 of the fingerprint FP may be not closely adhered to the upper substrate 32 (e.g., may be isolated from direct contact therewith by an interposing gap space) and include air therebetween (e.g., in the gap space), and accordingly, relatively large quantity of light may be reflected from the fingerprint FP to the light absorption layer 13 of the fingerprint sensor 10 that vertically overlaps the valley FP-2, such that a relatively large amount of charge (relative to the fingerprint sensor 10 that vertically overlaps ridge FP-1) is generated in said fingerprint sensor 10 that vertically overlaps the valley FP-2. Accordingly, quantity of light absorbed in the light absorption layer 13 of a given fingerprint sensor 10 may vary by a difference of quantity of light reflected between the fingerprint sensor 10 corresponding to (e.g., vertically overlapping) the ridge FP-1 of the fingerprint FP and the fingerprint sensor 10 corresponding to the valley FP-2 of the fingerprint FP, and accordingly, capacitance changes according to changes of the quantity of light reflected by different portions of the fingerprint FP to respective, corresponding fingerprint sensors 10 may be used to sense a shape of the fingerprint FP. The sensed shape of the fingerprint FP may be used to generate a fingerprint image of the fingerprint FP, and said generated fingerprint image may be compared with a fingerprint image stored in advance to judge a correspondence thereof. User authentication of a given user may be selectively granted based upon whether the generated fingerprint image is determined to match the stored fingerprint image within a certain confidence level (e.g., 90% confidence level match).

Figure 3:
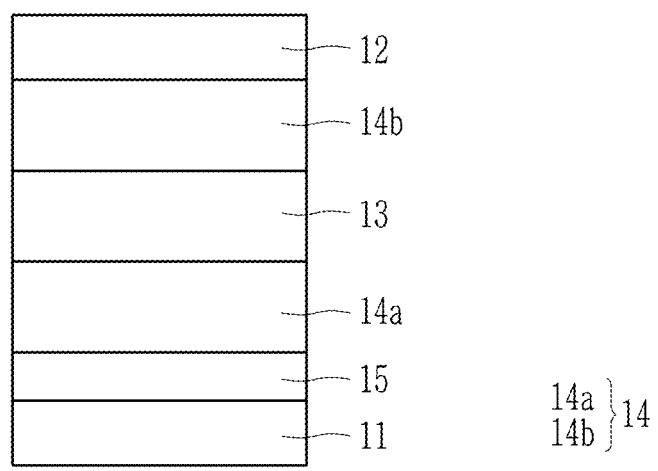
FIG. 3 is a cross-sectional view that schematically shows another example of a fingerprint sensor according to some example embodiments.

FIG. 3 is a cross-sectional view that schematically shows another example of a fingerprint sensor according to some example embodiments.

Referring to FIG. 3, the fingerprint sensor 10 according to some example embodiments includes the first electrode 11, the second electrode 12, the light absorption layer 13 between the first electrode 11 and the second electrode 12, and an insulation layer 14 between the first electrode 11 and the light absorption layer 13 and between the second electrode 12 and the light absorption layer 13, like some example embodiments. As described above, the insulation layer 14 includes a first insulation layer 14a and a second insulation layer 14b.

In some example embodiments, the fingerprint sensor 10 further includes a reflective layer 15.

The reflective layer 15 may be disposed under the light absorption layer 13, for example, between the first electrode 11 and the light absorption layer 13 and for example, between the first electrode 11 and the first insulation layer 14a. As shown in FIG. 3, the reflective layer 15 may be directly between the first insulation layer 14a and the first electrode 11 so as to be the only interposing element therebetween. The reflective layer 15 for example may prevent inflow of unnecessary light into the light absorption layer 13 from the direction of the first electrode 11, and thus improve fingerprint-sensing performance of the fingerprint sensor 10 by restricting absorbance, by the light absorption layer 13, of light that is not reflected from a fingerprint from a direction extending to the light absorption layer 13 via the second electrode 12 and second insulating layer 14b.

Figure 4:
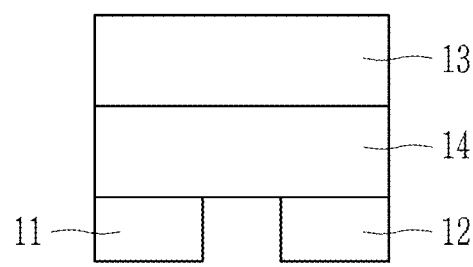
FIG. 4 is a cross-sectional view that schematically shows another example of a fingerprint sensor according to some example embodiments.

FIG. 4 is a cross-sectional view that schematically shows another example of a fingerprint sensor according to some example embodiments.

Referring to FIG. 4, the fingerprint sensor 10 according to some example embodiments includes the first electrode 11, the second electrode 12, the light absorption layer 13, and the insulation layer 14, like the aforementioned example embodiments.

In some example embodiments, including the example embodiments shown in FIG. 4, the first electrode 11 and the second electrode 12 are disposed in parallel with each other (e.g., are on a same axis that extends in parallel with a lower surface of the insulating layer 14 as shown in FIG. 4), wherein one side surface of the first electrode 11 faces one side surface of the second electrode 12 (e.g., the first and second electrodes 11 and 12 include opposing side surfaces. Restated, the first electrode 11 and the second electrode 12 may be in parallel with each other on a same side of the light absorption layer 13. Accordingly, when a particular (or, alternatively, predetermined) voltage is applied to the first electrode 11 and the second electrode 12, electrons and holes separated from excitons generated in the light absorption layer 13 may be polarized in a horizontal direction depending on the positive or negative voltage of the first electrode 11 and the second electrode 12, and thus generate an electric field.

In some example embodiments, the insulation layer 14 may be commonly positioned between the first electrode 11 and the light absorption layer 13 and between the second electrode 12 and the light absorption layer 13. Restated, and as shown in FIG. 4, the insulation layer 14 may be between the light absorption layer 13 and both the first and second electrodes 11 and 12. Restated, the insulation layer 14 and the light absorption layer 13 are each on both the first electrode 11 and the second electrode 12. The insulation layer 14 may respectively separate (e.g., isolate) the first electrode 11 from direct contact with the light absorption layer 13 and the second electrode 12 from direct contact with the light absorption layer 13 and thus be configured to block charges generated by light in the light absorption layer 13 from moving toward the first electrode 11 and the second electrode 12. As further shown in FIG. 4, the first and second electrodes 11 and 12 may be isolated from direct contact with each other (e.g., by an interposing gap space) and may be indirectly coupled via the insulation layer 14.

Figure 5:
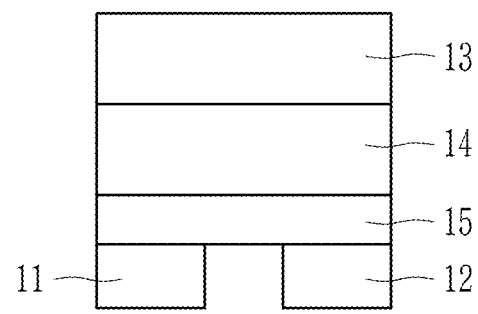
FIG. 5 is a cross-sectional view that schematically shows another example of a fingerprint sensor according to some example embodiments.

FIG. 5 is a cross-sectional view that schematically shows another example of a fingerprint sensor according to some example embodiments.

Referring to FIG. 5, the fingerprint sensor 10 according to some example embodiments includes the first electrode 11, the second electrode 12, the light absorption layer 13, and the insulation layer 14, which are disposed in parallel one another, like some example embodiments.

In some example embodiments, the fingerprint sensor 10 further includes a reflective layer 15.

The reflective layer 15 may be disposed under the light absorption layer 13, for example, between the first and second electrodes 11 and 12 and the light absorption layer 13, for example, between the first and second electrodes 11 and 12 and the insulation layer 14. Restated, and as shown in FIG. 5, the reflective layer 15 may be between the light absorption layer 13 and both the first and second electrodes 11 and 12. The reflective layer 15 may for example, and as described above with reference to the reflective layer 15 illustrated in FIG. 3, prevent inflow of unnecessary light into the light absorption layer 13 and thus improve fingerprint-sensing performance. As further shown in FIG. 5, the first and second electrodes 11 and 12 may be isolated from direct contact with each other (e.g., by an interposing gap space) and may be indirectly coupled via the reflective layer 15.

The aforementioned fingerprint sensor 10 may be repetitively disposed along a row and/or a column and thus form (e.g., establish) a fingerprint sensor array, such that the fingerprint sensor array includes an array of fingerprint sensors 10. The fingerprint sensor array may be configured to sense a fingerprint shape from separate capacitance changes sensed by separate, respective fingerprint sensors 10 of the fingerprint sensor array, and this fingerprint shape may be used to generate a fingerprint image that may be compared with the stored fingerprint shape (e.g., stored fingerprint image) to judge correspondence therebetween (e.g., determine whether the fingerprint shapes/images match within at least a threshold confidence level). In some example embodiments, a fingerprint sensor array may include an array of fingerprint sensors 10 that have different structures. For example, some fingerprint sensors 10 of a fingerprint sensor array may have the structure of the fingerprint sensor 10 illustrated in FIG. 2, and some fingerprint sensors 10 of the same fingerprint sensor array may have the structure of the fingerprint sensor 10 illustrated in FIG. 3, such that a limited portion (e.g., some but not all) of fingerprint sensors 10 of the fingerprint sensor array may include a reflective layer 15. The fingerprint sensors 10 having different structures may be arranged in one or more patterns in the fingerprint sensor array. For example, a fingerprint sensor array may include a central region of fingerprint sensors 10 having the structure of the fingerprint sensor 10 shown in FIG. 2 and a peripheral (e.g., edge) region of fingerprint sensors having the structure of the fingerprint sensor 10 shown in FIG. 3.

The fingerprint sensor 10 according to some example embodiments may further include a light source (not shown).

The fingerprint sensor 10 according to some example embodiments may be applied to (e.g., included in) various devices configured to perform fingerprint authentication to grant user access to one or more functions of said devices. For example, the fingerprint sensor may be applied to smartphones, mobile phones, tablets, personal computers, laptop computers, personal digital assistants (PDAs), enterprise digital assistants (EDAs) player, personal navigation devices, wearable computers, internet of things (IoT), internet of everything (IoE), drone, digital cameras, electronic books, door locks, safe deposit boxes, automatic teller machines (ATM), automobiles, any combination thereof, or the like.

Hereinafter, an example of a device using the aforementioned fingerprint sensor according to some example embodiments will be described.

Here, as an example of a device, a fingerprint sensor built-in display device is described with reference to a drawing.

Figure 7:
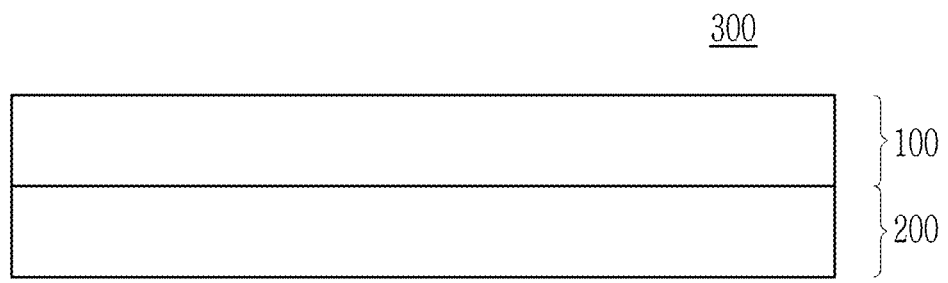
FIG. 7 is a schematic view showing a display device according to some example embodiments.
Figure 8:
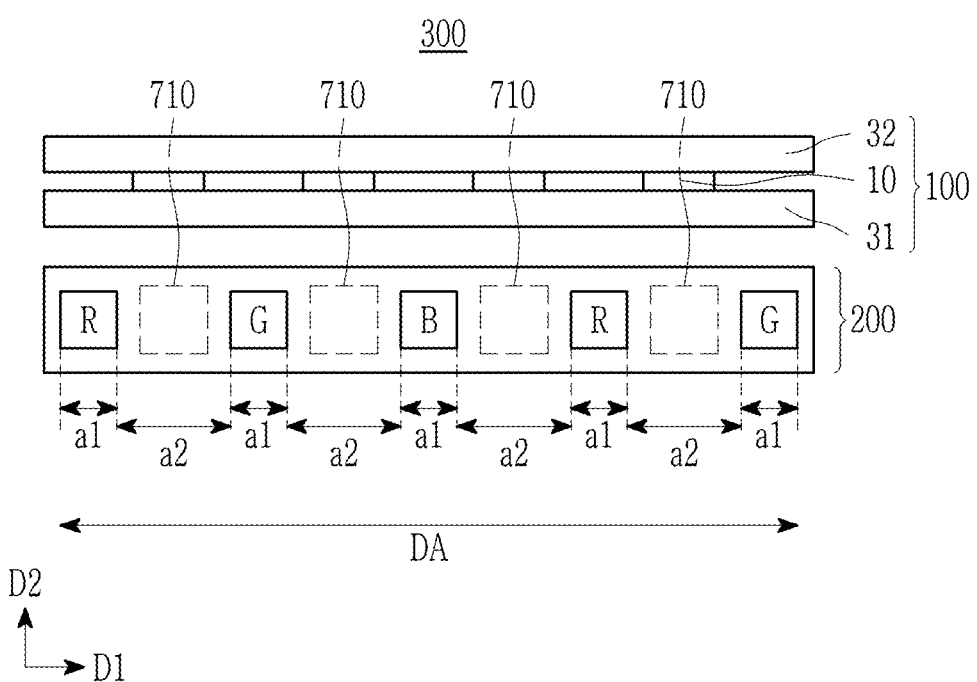
FIG. 8 is a cross-sectional view showing a disposition of the display device of FIG. 7.
Figure 9:
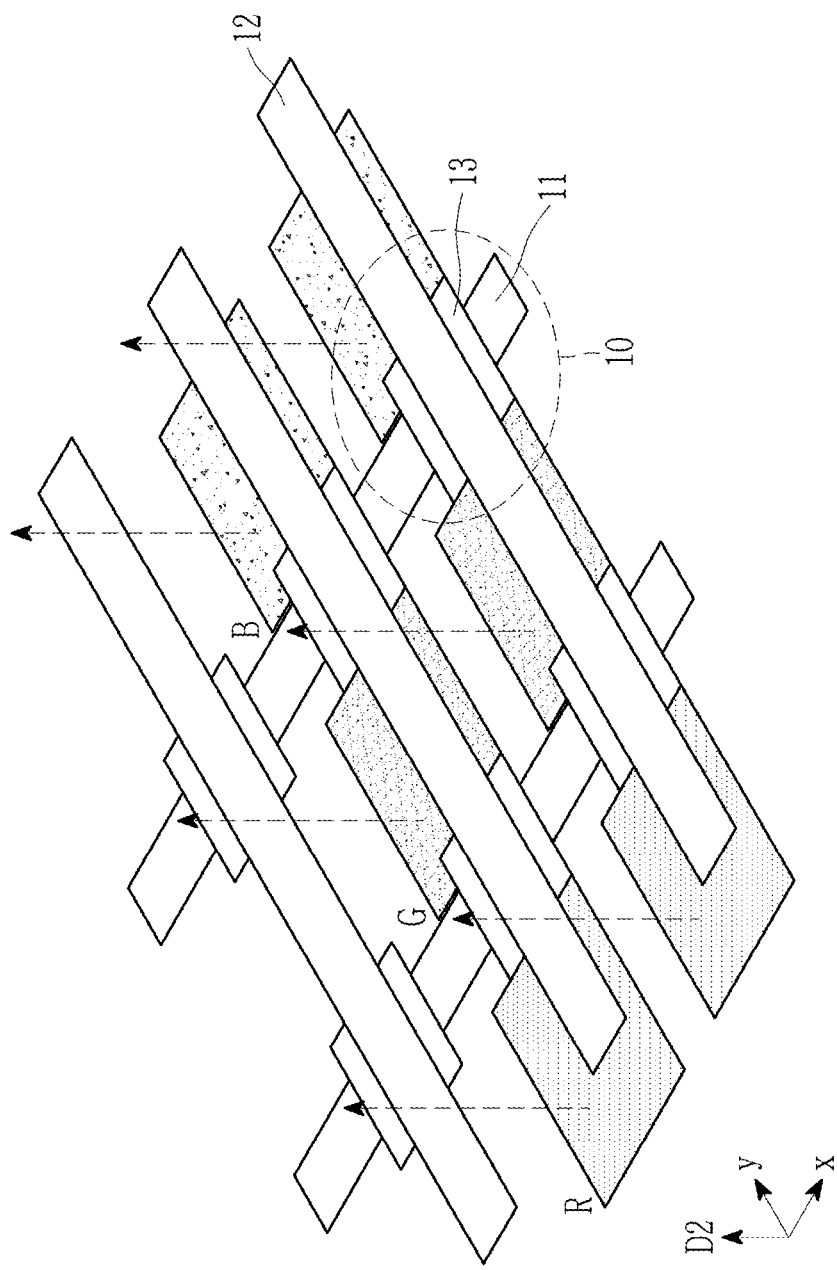
FIG. 9 is a schematic view showing an example of disposition of a display device of FIG. 7.
Figure 10:
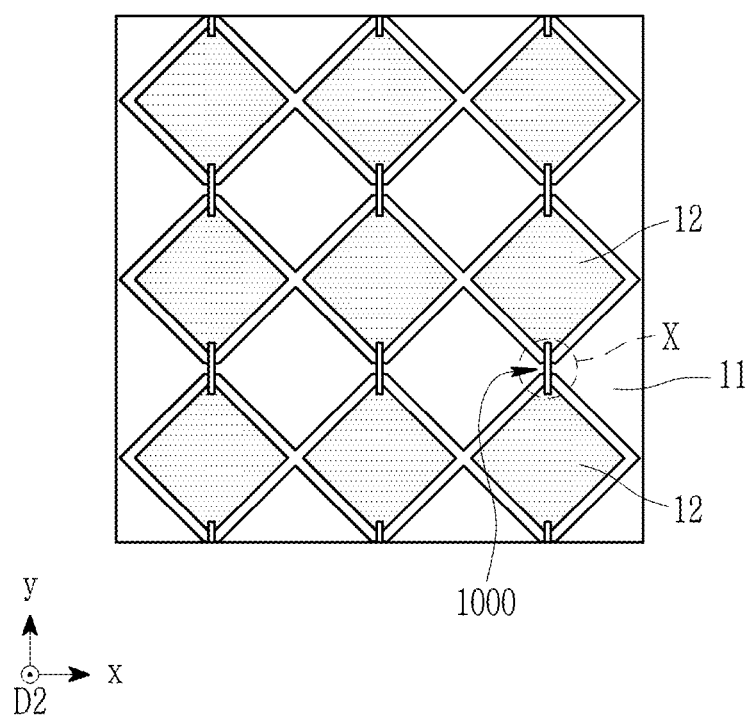
FIG. 10 is a schematic view showing another example of disposition of a display device of FIG. 7.
Figure 11:
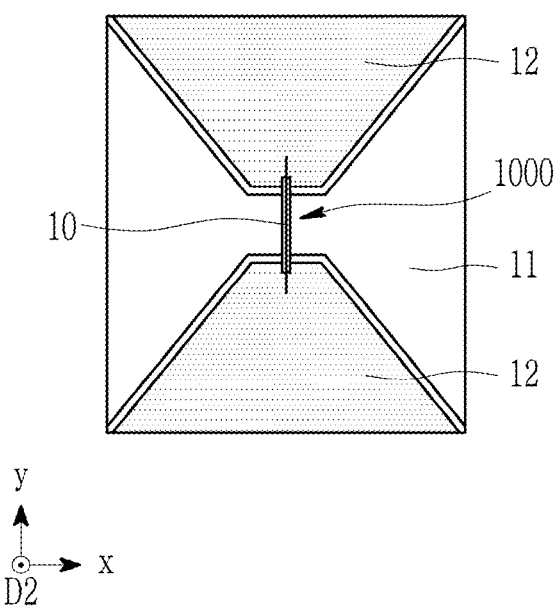
FIG. 11 is an enlarged schematic view of the X portion of FIG. 10.
Figure 12:
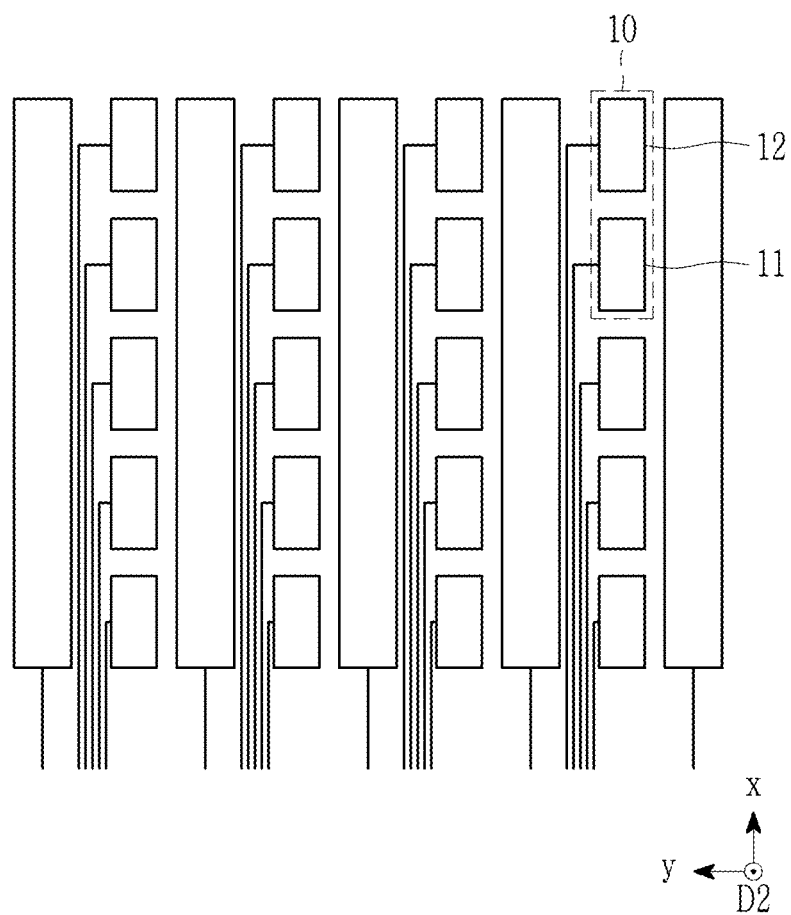
FIG. 12 is a schematic view showing another example of disposition of a display device of FIG. 7.

FIG. 7 is a schematic view showing a display device according to some example embodiments, FIG. 8 is a cross-sectional view showing a disposition of the display device of FIG. 7, FIG. 9 is a schematic view showing an example of disposition of a display device of FIG. 7, FIG. 10 is a schematic view showing another example of disposition of a display device of FIG. 7, FIG. 11 is an enlarged schematic view of the X portion of FIG. 10, and FIG. 12 is a schematic view showing another example of disposition of a display device of FIG. 7.

Referring to FIG. 7, a display device 300 according to some example embodiments includes a display panel 200 and a fingerprint sensor array 100.

The display panel 200 includes any panel configured to display an image without a particular limit, for example, a liquid crystal display panel, an organic light emitting display panel, a micro light emitting diode display panel, or a quantum dot display panel, but example embodiments are not limited thereto.

The display panel 200 includes a plurality of pixels arranged in an array. The display panel 200 includes a plurality of sub-pixels arranged in a matrix, where each pixel of the display panel 200 includes a separate set of sub-pixels. The sub-pixels include a red sub-pixel R configured to display red (e.g., emit red light), a green sub-pixel G configured to display green (e.g., emit green light), and a blue sub-pixel B configured to display blue (e.g., emit blue light), wherein one red sub-pixel R, one green sub-pixel G, and one blue sub-pixel B collectively form (e.g., establish) a separate pixel of the display panel 200. The plurality of sub-pixels are repetitively arranged in a matrix, for example, repetitively arranged along a row and/or a column.

Referring to FIG. 8, the display panel 200 include an area of the display panel 200 that is configured to display an image (e.g., emit light), that is, a display area DA, and the display area DA includes an active region a1 comprising the plurality of sub-pixels R, G, and B and a non-active region a2 that is the entire portion of the display area DA that excludes (e.g., is other than) the active region a1. Restated, the non-active region does not include the plurality of sub-pixels of the display panel 200. The non-active region a2 may include areas among (e.g., between) the plurality of sub-pixel R, G, and B, in which a wire or a light-blocking layer, for example, may be disposed.

The fingerprint sensor array 100 may be disposed on the display panel 200, for example, at the side of a user, such that the fingerprint sensor array 100 is located between the display panel 200 and an external environment that is external to the display device 300 and in which the user may be located. The fingerprint sensor array 100 may be disposed on a part (e.g., limited portion) or whole (e.g., entirety) of the display area DA of the display panel 200.

The fingerprint sensor array 100 includes a plurality (e.g., array) of fingerprint sensors 10. The plurality (e.g., array) of fingerprint sensors 10 may be for example arranged along a row and/or a column. The fingerprint sensor 10 may be disposed in the non-active region a2 out of the display area DA of the display panel 200, that is, in a region where the sub-pixels R, G, and B of the display panel 200 are not disposed, and accordingly, display quality deterioration due to the fingerprint sensor 10 may be prevented. For example, the fingerprint sensor 10 may be disposed in areas among the neighboring sub-pixels. Restated, and in reference to FIG. 8, where the display panel 200 includes a plurality of sub-pixels that are aligned in a horizontal direction (e.g., direction D1) extending parallel to the display panel 200 and are isolated from direct contact with each other in the horizontal direction by one or more interposing portions 710 of one or more non-active regions a2 of the display panel 200, the fingerprint sensors 10 of the fingerprint sensor array 100 may be aligned in the horizontal direction and isolated from direct contact with each other in the horizontal direction, and the fingerprint sensors 10 may each overlap a separate, respective portion 710 of the one or more non-active regions a2 of the display panel in a vertical direction (e.g., direction D2) extending perpendicular to the display panel 200, such that the fingerprint sensors 10 are each at least partially offset from the plurality of sub-pixels in the horizontal direction and thus at least partially do not overlap any of the sub-pixels in the vertical direction. A specific illustration of the fingerprint sensor 10 is the same as described above with reference to any of the example embodiments. As shown, one or more of the portions 710 overlapped by a fingerprint sensor 10 may be between two or more sub-pixels of the display panel 200.

It will be understood that an element that is on a portion of the display panel 200 that defines at least a portion of an active region a1 or a non-active region a2 will be understood to be "in" said region. For example, in FIG. 8, where the fingerprint sensors 10 are each on a portion 710 of the non-active region a2 of the display panel 200, the fingerprint sensors 10 will be understood to be "in" the non-active region a2 of the display panel 200.

While FIG. 8 illustrates example embodiments wherein the fingerprint sensors 10 each entirely overlap a separate portion 710 of one or more non-active regions in the vertical direction and entirely expose the sub-pixels of the display panel 200 in the vertical direction (e.g., direction D2), such that none of the sub-pixels are even at least partially overlapped by any of the fingerprint sensors 10 in the vertical direction, it will be understood that example embodiments are not limited thereto. For example, in some example embodiments, a fingerprint sensor 10 may partially overlap a portion 710 of a non-active region in the vertical direction and may further at least partially overlap a sub-pixel that is in an active region of the display panel 200, such that the fingerprint sensor 10 at least partially covers at least one sub-pixel of the display panel 200. Accordingly, it will be understood that, in some example embodiments, each separate fingerprint sensor 10 of a plurality of fingerprint sensors may at least partially overlap a separate portion 710 of the one or more non-active regions a2 of the display panel 200, such that the plurality of sub-pixels of the display panel 200 are at least partially exposed by the plurality of fingerprint sensors 10 in the vertical direction (e.g., direction D2).

For example, referring to FIG. 9 along with FIGS. 2, 7, and 8, the display panel 200 includes the active region a1 comprising the plurality of sub-pixels R, G, and B arranged in a matrix and the non-active region a2 other than the active region a1 (e.g., some or all regions of the display panel 200 that exclude the active region a1), and the fingerprint sensors 10 of the fingerprint sensor array 100 may be disposed in (e.g., at least partially vertically overlap) the non-active region a2. The fingerprint sensor array 100 includes the plurality of fingerprint sensors 10 arranged along a row and/or a column, wherein each fingerprint sensor 10 includes the first electrode 11 expending in a first direction (e.g., direction X), the second electrode 12 expending in a second direction (e.g., direction Y) differing from the first direction, where direction D1 may be either of directions X and Y, the light absorption layer 13 between the first electrode 11 and the second electrode 12 in the vertical direction (e.g., direction D2) at an intersected portion of the first electrode 11 and the second electrode 12 (e.g., may be between portions of the first and second electrodes 11 and 12 that overlap each other in the vertical direction (e.g., direction D2)), the first insulation layer 14a between the first electrode 11 and the light absorption layer 13, and the second insulation layer 14b between the second electrode 12 and the light absorption layer 13.

For example, referring to FIG. 9 along with FIGS. 3, 7, and 8, the fingerprint sensor array 100 may include the plurality of fingerprint sensors 10 arranged along a row and/or a column, wherein each fingerprint sensor 10 includes the first electrode 11 expending in the first direction (e.g., direction X), the second electrode 12 expending in the second direction (e.g., direction Y) differing from the first direction, the light absorption layer 13 between the first electrode 11 and the second electrode 12 at an intersected portion of the first electrode 11 and the second electrode 12 (e.g., may be between portions of the first and second electrodes 11 and 12 that overlap each other in the vertical direction (e.g., direction D2)), the first insulation layer 14a between the first electrode 11 and the light absorption layer 13, the second insulation layer 14b between the second electrode 12 and the light absorption layer 13, and the reflective layer 15 under the light absorption layer 13. The reflective layer 15 may prevent direct inflow of light from the display panel 200 into the light absorption layer 13 (e.g., via the direction of the first electrode 11) and thus reduce or prevent capacitance changes in the fingerprint sensor 10 due to the light directly coming out (e.g., emitted, displayed, etc.) from the display panel 200.

For example, referring to FIGS. 10 and 11 along with FIGS. 2, 7, and 8, the fingerprint sensor array 100 may include the plurality of fingerprint sensors 10 arranged along a row and/or a column, wherein each fingerprint sensor 10 includes the first electrode 11 including a plurality of diamond-shaped electrode patterns arranged along the first direction (e.g., direction X) and connected through a bridge, the second electrode 12 including a plurality of diamond-shaped electrode patterns arranged along the second direction (e.g., direction Y) differing from the first direction and connected through a bridge, the light absorption layer 13 between the first electrode 11 and the second electrode 12 at the bridge 1000 of the first electrode 11 and the second electrode 12, the first insulation layer 14a between the first electrode 11 and the light absorption layer 13, and the second insulation layer 14b between the second electrode 12 and the light absorption layer 13.

For example, referring to FIGS. 10 and 11 along with FIGS. 3, 7, and 8, the fingerprint sensor array 100 includes the plurality of fingerprint sensors 10 arranged along a row and/or a column, wherein the fingerprint sensor 10 may include the first electrode 11 including the plurality of diamond-shaped electrode patterns arranged along the first direction (e.g., direction X) and connected through the bridge 1000, the second electrode 12 including the plurality of diamond-shaped electrode patterns arranged along the second direction (e.g., direction Y) differing from the first direction and connected through the bridge, the light absorption layer 13 between the first electrode 11 and the second electrode 12 at the bridge of the first electrode 11 and the second electrode 12, the first insulation layer 14a between the first electrode 11 and the light absorption layer 13, the second insulation layer 14b between the second electrode 12 and the light absorption layer 13, and the reflective layer 15 under the light absorption layer 13. The reflective layer 15 may prevent direct inflow of light coming out from the display panel 200 directly into the light absorption layer 13 and thus reduce or prevent the capacitance changes in the fingerprint sensor 10 due to the light directly coming out from the display panel 200.

For example, referring to FIG. 12 along with FIG. 4, a plurality of fingerprint sensors 10 according to some example embodiments may be arranged in parallel along a row or a column (e.g., in direction X) and include the first electrode 11 and the second electrode 12 disposed parallel along a row or a column (e.g., in direction X), the insulation layer 14 on the first electrode 11 and the second electrode 12 (e.g., in direction D2), and the light absorption layer 13 on the insulation layer 14 (e.g., in direction D2).

For example, referring to FIG. 12 with FIG. 5, the fingerprint sensor 10 according to some example embodiments may be arranged along a row or a column (e.g., in direction X) and include the first electrode 11 and the second electrode 12 disposed in parallel along the row or the column (e.g., in direction X), the insulation layer 14 on the first electrode 11 and the second electrode 12 (e.g., in direction D2), the light absorption layer 13 on the insulation layer 14 (e.g., in direction D2), and the reflective layer 15 under the light absorption layer 13 (e.g., between the light absorption layer 13 and the insulation layer 14). The reflective layer 15 may prevent direct inflow of light from the display panel 200 to the light absorption layer 13 and thus reduce or prevent the capacitance changes in the fingerprint sensor 10 due to light directly coming from the display panel 200.

A display device 300 may further include a driving circuit (not shown), and when the display device 300 is a mobile device, an application processor may be further included.

Since the fingerprint sensors 10 according to some example embodiments may be collectively configured to sense a fingerprint shape from the capacitance changes according to a difference of quantity of light absorbed in the light absorption layers 13 of the fingerprint sensors 10, fingerprint-sensing performance may be simply and effectively improved.

In addition, a fingerprint sensor 10 according to some example embodiments is present in the display area of a display panel 200 and thus a display device 300 that includes the display panel 200 and fingerprint sensor 10 may omit a separate area, separate from the display panel 200, in which the fingerprint sensor 10 is located, and accordingly, the display area of the display panel 200 may occupy a larger proportion of the area of the display device 300. Furthermore, the fingerprint sensor 10 according to some example embodiments is disposed in the non-active region in the display area, that is, an area where sub-pixels are not disposed, and thus may reduce or prevent an influence of the fingerprint sensor 10 on a display quality (e.g., aperture ratio) of the display panel 200.

In addition, the fingerprint sensor 10 according to some example embodiments may be disposed as a fingerprint sensor array, as described above, and disposed not in a particular area in the display area but anywhere in the display area and thus increase convenience of a user. For example, the fingerprint sensor array may be located in a limited portion of the display area of the display panel 200. The limited portion may be a central portion of the display area, a peripheral or edge portion of the display panel, a ring portion of the display panel, any combination thereof, or the like.

In addition, the fingerprint sensor 10 according to some example embodiments is disposed on the display panel 200 and uses light coming out from the display panel 200 and thus may not require a separate light source. Restated, the display panel 200 may be controlled to emit light to be reflected from the fingerprint FP that is on the fingerprint sensor 10, such that the fingerprint sensor 10 may sense at least a portion of the fingerprint FP based on light, emitted by the display panel 200, that is reflected from the portion of the fingerprint FP, such that a display device 300 that includes the display panel 200 and fingerprint sensor 10 may omit a separate light source, separate from the display panel 200, to emit light for reflection from a fingerprint FP and thus detection by the fingerprint sensor 10.

In addition, the fingerprint sensor 10 according to some example embodiments may be configured to sense a fingerprint from the capacitance changes using light coming from the display panel 200 and thus needs no particular driving device such as a thin film transistor (TFT), unlike a conventional optical fingerprint sensor. Accordingly, a structure and a process of the fingerprint sensor 10 may be simplified.

In addition, the fingerprint sensor 10 according to some example embodiments may be configured to sense a fingerprint from the capacitance changes using light coming out from the display panel 200 and thus may prevent deterioration of a fingerprint resolution of a fingerprint image generated based on charges generated at one or more fingerprint sensors 10 due to an upper substrate, unlike a conventional electrostatic fingerprint sensor.

Hereinafter, example embodiments are illustrated in more detail with reference to examples. However, these are examples, and the present disclosure is not limited thereto.

EXAMPLE

Preparation of Fingerprint Sensor Sample 2 mm×2 mm ITO is sputtered on a glass substrate to form a 150 nm-thick lower electrode. Subsequently, aluminum oxide ($A_2O_x$, 0<x≤3) is thermally deposited on the lower electrode to form a 40 nm-thick lower insulation layer. On the lower insulation layer, a compound represented by Chemical Formula A (a p-type semiconductor) and C60 (an n-type semiconductor) are co-deposited in a volume ratio (thickness ratio) of 1:1 to form a 100 nm-thick light absorption layer. On the light absorption layer, aluminum oxide ($A_2O_x$, 0<x≤3) is thermally deposited to form a 40 nm-thick upper insulation layer. 2 mm×2 mm ITO is sputtered on the upper insulation layer to form an upper electrode. A glass plate is covered on the upper electrode for sealing to manufacture a sample for a fingerprint sensor.

[Chemical Formula A]

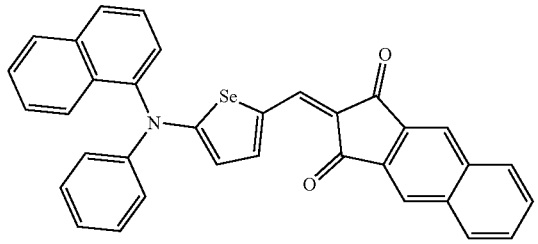

Evaluation I

Capacitance depending on quantity of light of the sample for a fingerprint sensor according to Example is evaluated.

The capacitance depending on quantity of light is evaluated by using a light-impedance-measuring equipment (TNE Tech Co., Ltd.) including light emitting diodes and an Impedance Analyzer. Capacitance changes depending on quantity of light is examined by vertically irradiating light of a diameter of 1 mm from the light emitting diode ($\lambda_{max}$=510 nm) into the sample for a fingerprint sensor according to Example.

Figure 13:
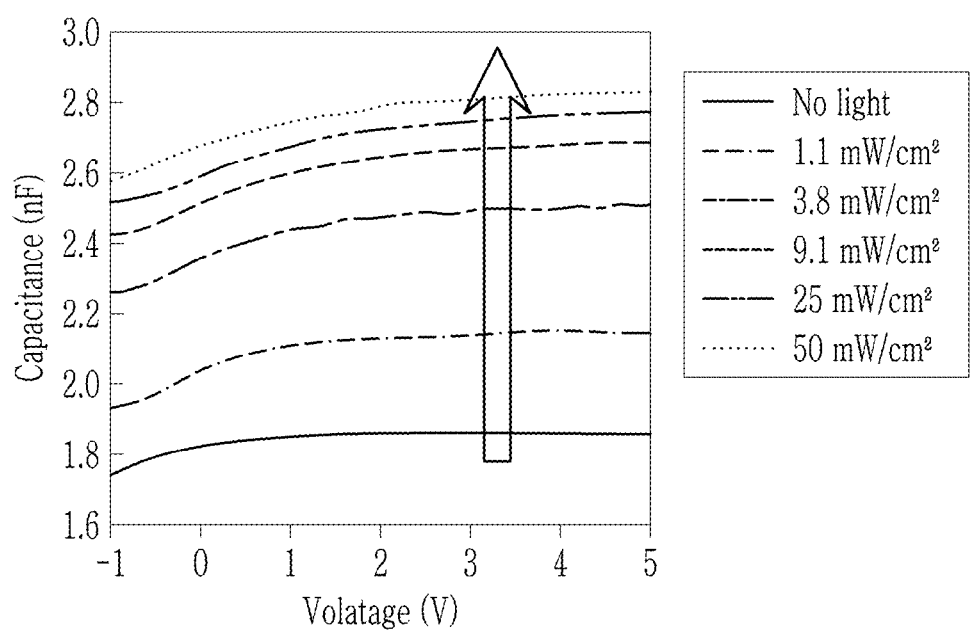
FIG. 13 is a graph showing capacitance changes according to the quantity of light of the sample for the fingerprint sensor according to some example embodiments.

The results are shown in FIG. 13.

FIG. 13 is a graph showing the capacitance changes depending on the quantity of light of the sample for a fingerprint sensor according to some example embodiments.

Referring to FIG. 13, as for the sample for a fingerprint sensor according to Example, as the quantity of light is increased, the capacitance depending on quantity of light is increased. Accordingly, the capacitance changes depending on quantity of light reflected by a fingerprint may be identified and used to effectively sense the fingerprint.

Evaluation II

Current characteristics depending on quantity of light of the sample for a fingerprint sensor according to Example are evaluated.

The current characteristics depending on quantity of light are evaluated through the light-impedance measurement equipment (TNE Tech Co., Ltd.) including a light emitting diode and an Impedance Analyzer. The sample for a fingerprint sensor according to Example is vertically irradiated by light of a diameter of 1 mm from the light emitting diode ($\lambda_{max}$=510 nm), and current changes depending on the quantity of light is examined.

Figure 14:
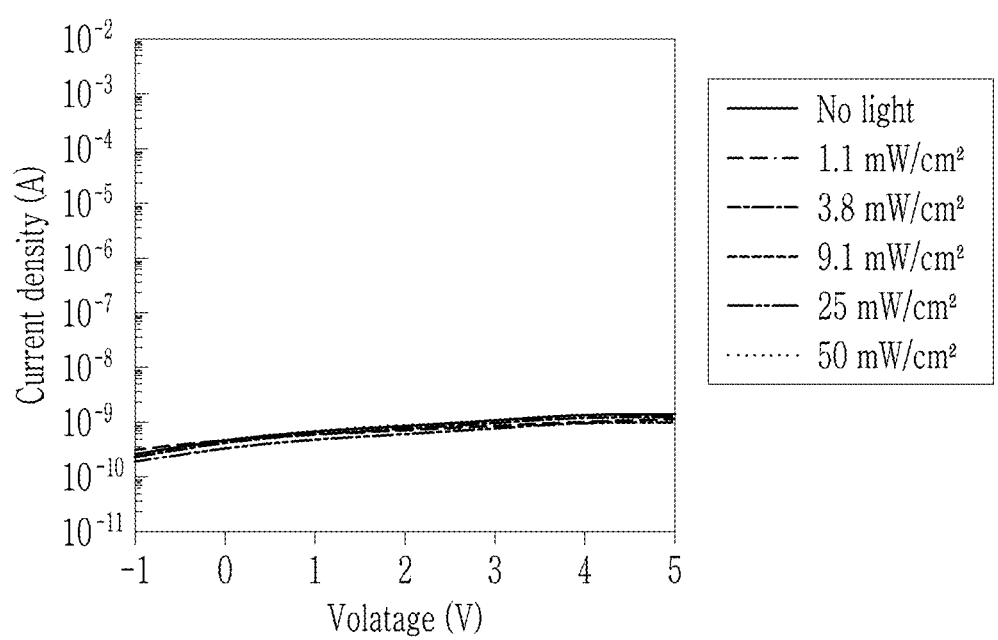
FIG. 14 is a graph showing the current characteristics according to the quantity of light of the sample for the fingerprint sensor according to some example embodiments.

The results are shown in FIG. 14.

FIG. 14 is a graph showing the current characteristics according to the quantity of light of the sample for the fingerprint sensor according to Example.

Referring to FIG. 14, the sample for a fingerprint sensor according to Example exhibits no current changes depending on the quantity of light. Accordingly, the sample for a fingerprint sensor according to Example exhibits no noise due to the current changes and thus may be effectively used to sense a fingerprint shape by the capacitance changes in the fingerprint sensor alone. Such a fingerprint sensor may have any of the structures of any of the example embodiments of fingerprint sensor 10, and thus it will be understood that the fingerprint sensor 10 according to any of the example embodiments may exhibit the current characteristics shown in FIG. 14. Therefore, it will be understood that the fingerprint sensor 10 according to any of the example embodiments may be configured to exhibit no current changes according to a quantity (e.g., amount, intensity, etc.) of light absorbed in the light absorption layer 13 of the fingerprint sensor. It will be understood that a fingerprint sensor configured to exhibit no current changes according to a quantity of light absorbed in the light absorption layer of the fingerprint sensor may be configured to exhibit no "substantial" current changes according to the quantity of light absorbed in the light absorption layer, where current changes that are not substantial may be current changes that are within a tolerance of ±10% around the value(s) of the current characteristics (e.g., value of current density in at least the light absorption layer 13 of the fingerprint sensor 10).

Figure 15:
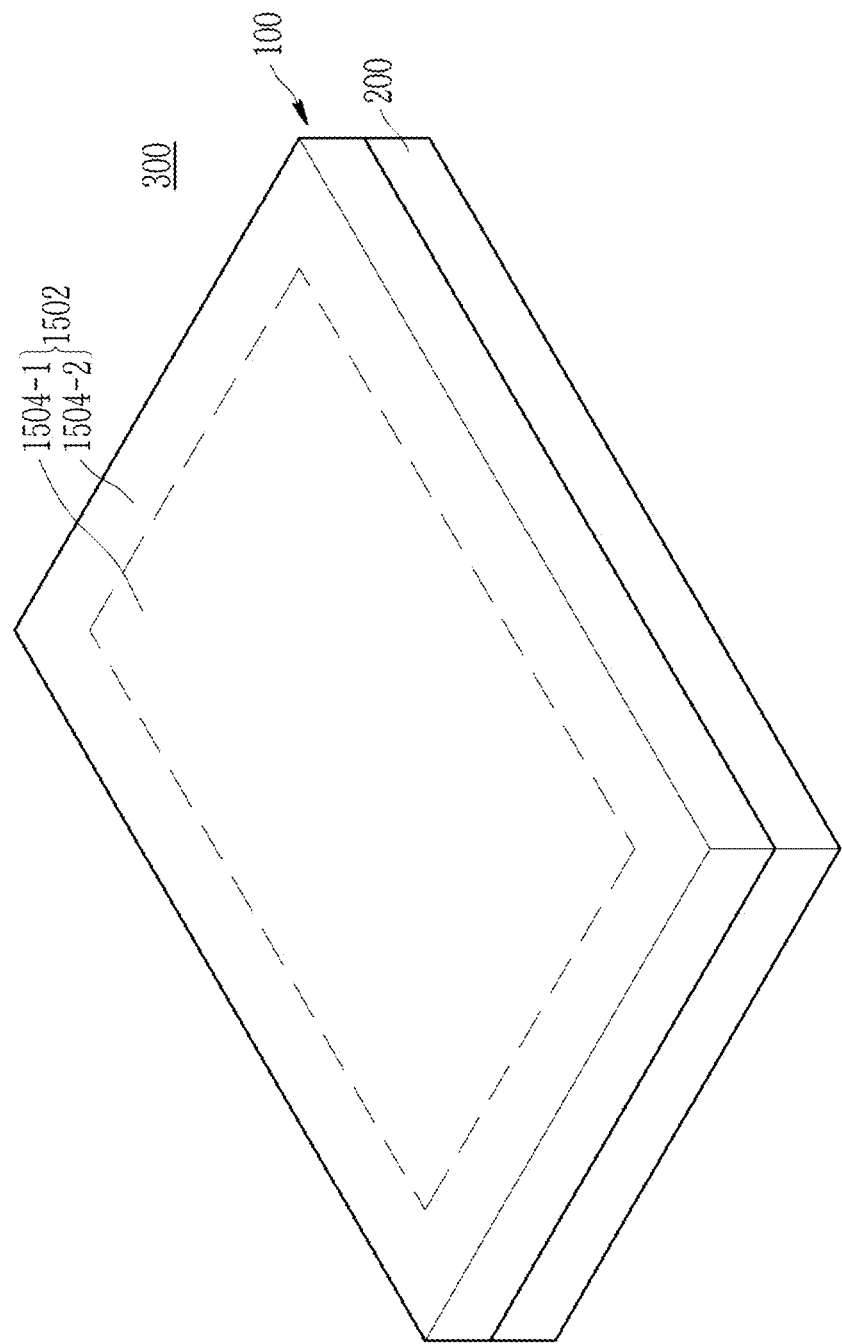
FIG. 15 is a view of a display device according to some example embodiments.

FIG. 15 is a view of a display device according to some example embodiments.

Referring to FIG. 15, in some example embodiments a display device 300 may include a display panel 200 and a fingerprint sensor array 100 on the display panel 200, wherein the fingerprint sensor array 100 includes a plurality of fingerprint sensors 1502 (which may each be a fingerprint sensor 10 according to any of the example embodiments herein) that further includes at least two separate sets 1504-1 and 1504-2 of one or more fingerprint sensors.

In some example embodiments, separate sets of fingerprint sensors 1504-1 and 1504-2 may have different fingerprint sensor structures. For example, in FIG. 15, the set of one or more fingerprint sensors 1504-2 may include fingerprint sensors 10 that have the structure of the fingerprint sensor 10 shown in FIG. 3, and the set of one or more fingerprint sensors 1504-1 may include fingerprint sensors 10 that have the structure of the fingerprint sensor 10 shown in FIG. 2, such that the fingerprint sensor(s) of set 1504-2 have a different structure than the fingerprint sensor(s) of set 1504-1 in that the fingerprint sensor(s) of set 1504-2 each include a reflective layer 15 and the fingerprint sensor(s) of set 1504-1 each do not include a reflective layer 15.

In some example embodiments, including the example embodiments shown in FIG. 15, at least one set of one or more fingerprint sensors 1504-1, 1504-2 defines a pattern on the display panel 200. For example, as shown in FIG. 15, where the plurality of fingerprint sensors 1502 are on the display panel, the set 1504-2 of one or more fingerprint sensors may extend entirely around the set 1504-1 of one or more fingerprint sensors, such that the set 1504-2 defines a ring pattern on the display panel 200. It will be understood that patterns that may be defined on the display panel 200 are not limited to a ring pattern.

Figure 16:
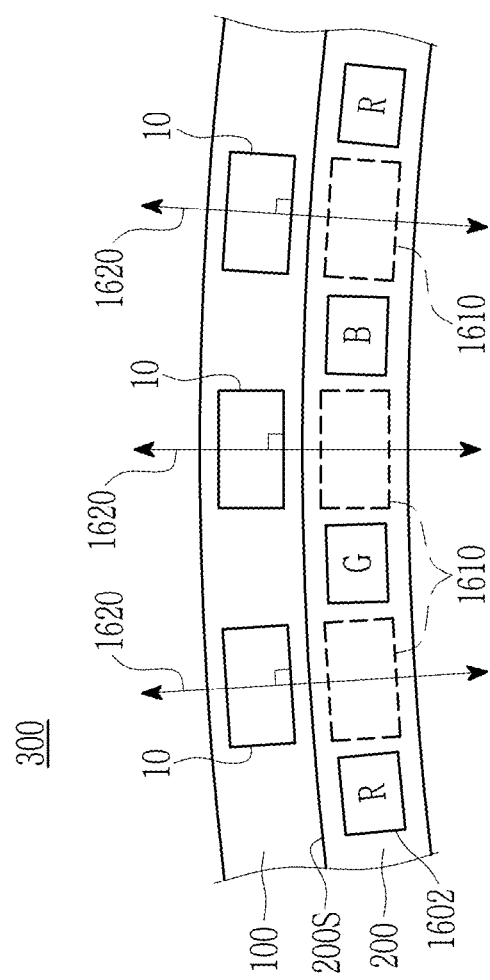
FIG. 16 is a schematic view showing a display device according to some example embodiments.

FIG. 16 is a schematic view showing a display device according to some example embodiments.

In some example embodiments, including the example embodiments shown in FIG. 16, at least a portion of the display panel 200 is a curved portion, such that the upper surface 200S of the display panel 200 defines a curved surface. The curve of the curved surface may be a three-dimensional curve. As shown in FIG. 16, at least one fingerprint sensor 10 of the plurality of fingerprint sensors of the fingerprint sensor array 100 may be on the curved portion of the display panel 200. As shown, each separate fingerprint sensor 10 of the fingerprint sensor array 100 may at least partially overlap a separate portion 1610 of one or more non-active regions of the display panel 200, such that each separate fingerprint sensor 10 is associated with a separate normal vector 1620 that extends, normal to the upper surface 200S of the display panel 200 through both the given separate fingerprint sensor 10 and the corresponding separate, at least partially overlapped portion 1610 of the one or more non-active regions of the display panel 200.

Figure 17:
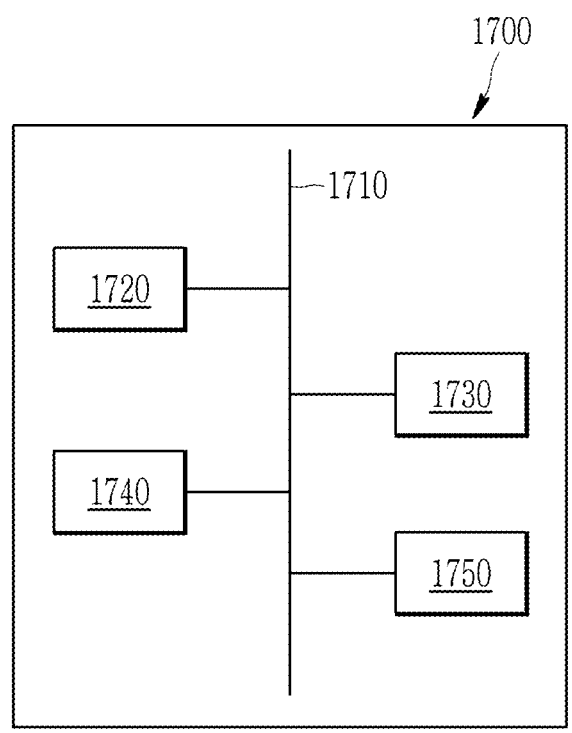
FIG. 17 is a diagram illustrating a device that includes one or more display panels according to some example embodiments.

FIG. 17 is a diagram illustrating a device that includes one or more display panels according to some example embodiments.

Referring to FIG. 17, device 1700, which may be an electronic device, includes a bus 1710, a processor 1720, a memory 1730, a user interface 1750 and one or more display devices 1740. As shown, in some example embodiments, the processor 1720, a memory 1730, user interface 1750, and one or more display devices 1740 may communicate with one another through the bus 1710. The user interface 1750 may be any known user interface for an electronic device, including a keypad, touchscreen interface, any combination thereof, or the like.

The one or more display devices 1740 may each be any of the display devices 300 included in any of the example embodiments.

The processor 1720 may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of the processor 1720 and/or one or more display devices 1740.

Referring back to at least FIGS. 8 and 6, the processor 1720 may partially or entirely implement the functionality of the display device 300 to implement fingerprint recognition to authenticate a user and enable user interaction with one or more aspects of (e.g., functionality of) device 1700 via user interface 1750. For example, based on a determination that user authentication is to be performed to enable user access (e.g., based on user interaction with the user interface 1750 which causes processor 1720 to responsively determine that user authentication is to be performed to enable user access to some or all of the device 1700 functionality), the processor 1720 may execute a program of instructions stored at the memory 1730 to 1) control the display panel to cause one or more sub-pixels to emit light (e.g., generate one or more command signals that are transmitted to the one or more display devices 1740 to cause the one or more sub-pixels of the display panel 200 of the one or more display devices 1740 to emit light), 2) drive the fingerprint sensor array 100 to cause the fingerprint sensors 10 to generate separate, respective electrical signals based on changes in capacitance in the light absorption layers 13 of the plurality of fingerprint sensors 10 in response to reflection of the emitted light from an object (e.g., generate one or more command signals that are transmitted to the one or more display devices 1740 to cause the one or more fingerprint sensors 10 of the fingerprint sensor array 100 of the one or more display devices 1740 to generate one or more electrical signals based on being irradiated with reflection of the emitted light from an object (e.g., a fingerprint on the display device(s) 1740), 3) generate an image of the object based on the electrical signals (e.g., process the electrical signals received from the separate fingerprint sensors 10 to generate an image of the object where separate electrical signals from separate fingerprint sensors are processed to establish separate pixels of the image), 4) compare the generated image with a stored image, and 5) selectively grant user access to at least a portion of the device, via a user interface of the device, based on a determination of whether the generated image matches the stored image within a threshold confidence level (e.g., 90% confidence level). As referred to herein, a confidence level refers to a proportion of the generated image pixels that match corresponding pixels of the stored image; thus, a match between the generated image and the stored image within a 90% confidence interval will be understood to mean that the generated image is at least a 90% match to the stored image. The processor 1720 may control display operations of the one or more display devices 1740 to display one or more images and/or may control recognition operations implemented based at least in part upon at least one or more fingerprint sensors included in the one or more display devices 1740.

It will be understood that the memory 1730 may store a program of instructions and the processor 1720 may execute the stored program of instructions to implement functionality associated with the device 1700 and/or one or more display devices 1740, including performing one or more biometric recognition operations.

The units and/or modules described herein may be implemented using hardware components and software components. For example, the hardware components may include microphones, amplifiers, band-pass filters, audio to digital convertors, and processing devices. A processing device may be implemented using one or more hardware device configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure has been described in connection with what is presently considered to be practical example embodiments, it is to be understood that the inventive concepts are not limited to the disclosed example embodiments. On the contrary, the disclosure is intended to cover various modifications and equivalent arrangements included within the spirit and scope of the appended claims.

What is claimed is:

1. A fingerprint sensor, comprising:
a first electrode;
a second electrode;
a light absorption layer isolated from direct contact with the first electrode, the light absorption layer isolated from direct contact with the second electrode, the light absorption layer configured to absorb light to generate charges; and
an insulation layer between the first electrode and the light absorption layer, the insulation layer between the second electrode and the light absorption layer, the insulation layer configured to
block the charges generated in the light absorption layer from moving toward the first electrode such that current does not flow between the first electrode and the light absorption layer, and
block the charges generated in the light absorption layer from moving toward the second electrode such that current does not flow between the second electrode and the light absorption layer.

2. The fingerprint sensor of claim 1, wherein
the light absorption layer includes a p-type semiconductor and an n-type semiconductor, and
at least one of the p-type semiconductor or the n-type semiconductor is a light absorbing material configured to absorb light in at least a portion of a visible wavelength region.

3. The fingerprint sensor of claim 2, wherein the light absorbing material includes an organic light absorbing material.

4. The fingerprint sensor of claim 1, further comprising:
a reflective layer between the light absorption layer and the first electrode.

5. The fingerprint sensor of claim 1, wherein
the first electrode and the second electrode are on opposite sides of the light absorption layer, such that the light absorption layer is between the first electrode and the second electrode, and
the insulation layer includes
a first insulation layer between the first electrode and the light absorption layer, and
a second insulation layer between the second electrode and the light absorption layer.

6. The fingerprint sensor of claim 1, wherein
the first electrode and the second electrode are in parallel with each other on a same side of the light absorption layer, and
the insulation layer and the light absorption layer are each on both the first electrode and the second electrode.

7. The fingerprint sensor of claim 1, wherein the fingerprint sensor is configured to sense capacitance changes according to an intensity of light absorbed in the light absorption layer.

8. The fingerprint sensor of claim 1, wherein the fingerprint sensor is configured to have no substantial current changes according to an intensity of light absorbed in the light absorption layer.

9. A fingerprint sensor array comprising the fingerprint sensor of claim 1.

10. A device comprising the fingerprint sensor of claim 1.

11. A device, comprising:
a display panel configured to display an image in a display area of the display panel; and
a fingerprint sensor array on the display panel, the fingerprint sensor array including a plurality of fingerprint sensors, each fingerprint sensor of the plurality of fingerprint sensors including
a first electrode,
a second electrode,
a light absorption layer isolated from direct contact with the first electrode, the light absorption layer isolated from direct contact with the second electrode, the light absorption layer configured to absorb light to generate charges, and
an insulation layer between the first electrode and the light absorption layer, the insulation layer between the second electrode and the light absorption layer, the insulation layer configured to
block the charges generated in the light absorption layer from moving toward the first electrode such that current does not flow between the first electrode and the light absorption layer, and
block the charges generated in the light absorption layer from moving toward the second electrode such that current does not flow between the second electrode and the light absorption layer.

12. The device of claim 11, wherein the plurality of fingerprint sensors are in some or all of the display area of the display panel.

13. The device of claim 12, wherein
the display area of the display panel includes
an active region including a plurality of sub-pixels configured to emit light, and
a non-active region that does not include the plurality of sub-pixels,
wherein the plurality of fingerprint sensors are in the non-active region such that the plurality of fingerprint sensors at least partially do not vertically overlap any sub-pixels of the plurality of sub-pixels.

14. The device of claim 13, wherein the plurality of fingerprint sensors each vertically overlap a separate portion of the display panel that is between at least two adjacent sub-pixels of the plurality of sub-pixels.

15. The device of claim 11, wherein each fingerprint sensor further includes a reflective layer between the light absorption layer and the first electrode.

16. The device of claim 11, wherein
the first electrode extends in a first direction,
the second electrode extends in a second direction that intersects the first direction, and
the light absorption layer is between the first electrode and the second electrode at a bridge of the first electrode and the second electrode.

17. The device of claim 16, wherein the insulation layer includes
a first insulation layer between the first electrode and the light absorption layer, and
a second insulation layer between the second electrode and the light absorption layer.

18. The device of claim 11, wherein
the first electrode and the second electrode are in parallel with each other on a same side of the light absorption layer, and
the insulation layer and the light absorption layer are each on both the first electrode and the second electrode.

19. The device of claim 11, wherein
the light absorption layer includes a p-type semiconductor and an n-type semiconductor, and
at least one of the p-type semiconductor or the n-type semiconductor is a light absorbing material configured to absorb light in at least a portion of a visible wavelength region.

20. The device of claim 11, wherein
each fingerprint sensor is configured to sense capacitance changes according to an intensity of light absorbed in the light absorption layer of the each fingerprint sensor, and
the each fingerprint sensor is configured to have no substantial current changes according to the intensity of light absorbed in the light absorption layer of the each fingerprint sensor.

21. A device, comprising:
a display panel including a plurality of sub-pixels, the plurality of sub-pixels isolated from direct contact with each other by one or more non-active regions of the display panel; and
a fingerprint sensor array on the display panel, the fingerprint sensor including a plurality of fingerprint sensors, each separate fingerprint sensor of the plurality of fingerprint sensors at least partially overlapping a separate portion of the one or more non-active regions of the display panel, such that the plurality of sub- pixels are at least partially exposed by the plurality of fingerprint sensors, each fingerprint sensor including
a first electrode,
a second electrode,
a light absorption layer isolated from direct contact with the first electrode, the light absorption layer isolated from direct contact with the second electrode, the light absorption layer configured to absorb light to generate charges, and an insulation layer between the first electrode and the light absorption layer, the insulation layer between the second electrode and the light absorption layer, the insulation layer configured to block the charges generated in the light absorption layer from moving toward the first electrode such that current does not flow between the first electrode and the light absorption layer, and block the charges generated in the light absorption layer from moving toward the second electrode such that current does not flow between the second electrode and the light absorption layer.

22. The device of claim 21, further comprising:
a memory storing a program of instructions; and
a processor configured to execute the program of instructions to
control the display panel to cause one or more sub-pixels of the plurality of sub-pixels to emit light,
drive the fingerprint sensor array to cause the plurality of fingerprint sensors to generate separate, respective electrical signals based on changes in capacitance in the light absorption layers of the plurality of fingerprint sensors in response to reflection of the emitted light from an object,
generate an image of the object based on the electrical signals,
compare the generated image with a stored image, and
selectively grant user access to at least a portion of the device, via a user interface of the device, based on a determination of whether the generated image matches the stored image within a threshold confidence level.

23. The device of claim 21, wherein
at least a portion of the display panel is a curved portion, and
at least one fingerprint sensor of the plurality of fingerprint sensors is on the curved portion of the display panel.

24. The device of claim 21, wherein
at least two sets of one or more fingerprint sensors of the plurality of fingerprint sensors have different structures.

25. The device of claim 24, wherein at least one set of one or more fingerprint sensors defines a pattern on the display panel.

26. The device of claim 21, wherein each fingerprint sensor of the plurality of fingerprint sensors further includes a reflective layer between the light absorption layer and the first electrode.

27. The device of claim 21, wherein
the first electrode extends in a first direction,
the second electrode extends in a second direction that intersects the first direction, and
the light absorption layer is between the first electrode and the second electrode at a bridge of the first electrode and the second electrode.

28. The device of claim 27, wherein the insulation layer includes
a first insulation layer between the first electrode and the light absorption layer, and
a second insulation layer between the second electrode and the light absorption layer.

29. The device of claim 21, wherein
the first electrode and the second electrode extend in parallel with each other on a same side of the light absorption layer, and
the insulation layer and the light absorption layer are each on both the first electrode and the second electrode.

30. The device of claim 21, wherein
the light absorption layer includes a p-type semiconductor and an n-type semiconductor, and
at least one of the p-type semiconductor or the n-type semiconductor is a light absorbing material configured to absorb light in at least a portion of a visible wavelength region.

31. The device of claim 21, wherein
each fingerprint sensor is configured to sense capacitance changes according to a quantity of light absorbed in the light absorption layer of the each fingerprint sensor, and
the each fingerprint sensor is configured to have no substantial current changes according to the quantity of light absorbed in the light absorption layer of the each fingerprint sensor.

* * * * *